United States Patent
He et al.

(10) Patent No.: US 11,342,726 B2
(45) Date of Patent: May 24, 2022

(54) TUNABLE SEMICONDUCTOR LASER BASED ON HALF-WAVE COUPLED PARTIAL REFLECTORS

(71) Applicant: ZHEJIANG UNIVERSITY, Zhejiang (CN)

(72) Inventors: Jianjun He, Zhejiang (CN); Jia Guo, Zhejiang (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 16/986,177

(22) Filed: Aug. 5, 2020

(65) Prior Publication Data

US 2020/0366061 A1    Nov. 19, 2020

Related U.S. Application Data

(63) Continuation of application No. PCT/CN2018/084333, filed on Apr. 25, 2018.

(30) Foreign Application Priority Data

Feb. 5, 2018 (CN) .......................... 201810113412.4

(51) Int. Cl.
*H01S 5/10* (2021.01)
*H01S 5/0625* (2006.01)

(52) U.S. Cl.
CPC ........ *H01S 5/1021* (2013.01); *H01S 5/06255* (2013.01); *H01S 5/1014* (2013.01)

(58) Field of Classification Search
CPC ....... H01S 5/1021; H01S 5/06255; H01S 5/10

USPC ............................................ 385/22; 359/283
See application file for complete search history.

(56) References Cited

U.S. PATENT DOCUMENTS

| 6,043,104 A * | 3/2000 | Uchida ................. H01S 5/1021 438/32 |
| 7,382,817 B2 | 6/2008 | He | |
| 2005/0053322 A1* | 3/2005 | Jenkins ................ G02B 6/2813 385/22 |
| 2005/0249256 A1 | 11/2005 | He | |

FOREIGN PATENT DOCUMENTS

| CN | 101343253 A | 1/2009 |
| CN | 101859981 A | 10/2010 |

* cited by examiner

*Primary Examiner* — Tuan N Nguyen

(57) ABSTRACT

The present invention discloses a tunable semiconductor laser based on half-wave coupled partial reflectors. The laser comprises two resonant cavities; one resonant cavity is mainly composed of an optical waveguide, a first partial reflector and a second partial reflector, and the other resonant cavity is mainly composed of an optical waveguide, a first partial reflector and a second partial reflector. The resonant cavities are arranged along the same straight line and coupled to each other, and the two second partial reflectors in the two resonant cavities are connected by a common coupling waveguide. The present invention has the best single-mode selection, and an emitted wavelength can be switched between a series of channels; an optical grating needs not to be manufactured, and the structure is simple; and the laser has a high degree of freedom in coupler design and a great manufacturing tolerance and can realize large-scale digital tuning.

6 Claims, 12 Drawing Sheets

US 11,342,726 B2

TUNABLE SEMICONDUCTOR LASER BASED ON HALF-WAVE COUPLED PARTIAL REFLECTORS

CROSS-REFERENCE TO RELATED APPLICATIONS

This application is a continuation of International Patent Application No. PCT/CN2018/084333, filed on Apr. 25, 2018, which claims the benefit of priority from Chinese Patent Application No. 201810113412.4, filed on Feb. 5, 2018. The contents of the aforementioned application, including any intervening amendments thereto, are incorporated herein by reference in its entirety.

TECHNICAL FIELD

The present invention relates to a semiconductor laser, and more particularly to a tunable semiconductor laser based on half-wave coupled part reflectors.

BACKGROUND OF THE PRESENT INVENTION

Wavelength tunable lasers have been widely used in wavelength division multiplexing (WDM) systems, metropolitan optical networks and remote optical communications. With the development of a large-scale photonic integrated technology, tunable semiconductor lasers are required to be with low cost, low power consumption and small size.

Most of the traditional wavelength tunable lasers applied in the optical communication field are based on gratings to achieve single-mode output, such as a distributed feedback laser (DFB) and a distributed reflection grating laser (DBR). For DBR laser, by changing the refractive index of grating area, the output wavelength can be changed with the movement of a reflection peak wavelength of the DBR grating. The tuning range of such a laser is limited to 10 nm due to the limitation of commonly achievable refractive index change in semiconductor materials. So some more sophisticated tunable lasers based on gratings with a wider tuning range have been proposed, such as a digital super-mode distributed feedback (DS-DBR) laser and a sampled grating distributed Bragg reflector (SGDBR) laser. However, these kinds of lasers all need grating etching and epitaxial regrowth which can greatly increase the cost of device.

A wavelength switchable laser can also be realized by using two coupled cavities with slightly different lengths. For this kind of laser, the tuning range can be greatly increased by the Vernier effect. The two cavities are connected through a coupler and satisfy certain coupling relation to achieve high mode selectivity. Such coupler can be fabricated by etching a groove or using micro machining technology. However, the performance of these kinds of coupled-cavity lasers is limited by the large fabrication difficulty. Their mode selectivity is generally poor which limits their use in practical applications.

In a U.S. patent application Ser. No. 11/306,520 entitled "V-coupled-cavity semiconductor laser", a novel type of coupled cavity structure is disclosed. Based on a half-wave mode selection theory and the Vernier effect, this kind of structure has wide tuning range, improved mode selectivity, and more importantly, a much easier fabrication process. The present patent application discloses a new design of a coupled cavity structure based on a similar operation principle. This structure can achieve a high side-mode suppression ratio and a wide tuning range. The simple tuning mechanism and simple fabrication process make it practical in application. Moreover, the laser only consists of straight waveguide, thus it has no extra bend loss and can be easily integrated into a large scale photonic circuit.

SUMMARY OF THE PRESENT INVENTION

With respect to defects in the prior art, a purpose of the present invention is to provide a tunable semiconductor laser based on half-wave coupled partial reflectors.

Technical solutions of the present invention are as follows:

The present invention includes two resonant cavities. Each resonant resonant cavity is composed of an optical waveguide and two partial reflectors. One partial reflector is used as an output port and the other is used as a coupling element. Said coupling element could reflect part of the light back to the original resonant cavity and transmit remaining light to the other one. In one embodiment, such coupling element could be achieved through an optical beam expander and a central transmissive total internal reflection (TIR) corner mirror group.

The two optical resonant cavities have different optical path lengths thus only one resonant frequency of the two resonant cavities coincides within the gain spectrum. At least a portion of one optical waveguide can be pumped to provide optical gain. Changing the current applied into at least a portion of one optical waveguide can change its refractive index and consequently switch the output wavelength between several channels.

The two optical resonant cavities are arranged in a line. Their coupling elements are back-to-back connected through a short coupling waveguide and form a half-wave bow-tie coupler. The bow-tie coupler could produce a half-wave cross-coupling phase with an optimum coupling coefficient between two resonant cavities in order to achieve high single-mode selectivity of the laser.

DETAILED DESCRIPTION OF THE PRESENT INVENTION

Figure 1A:
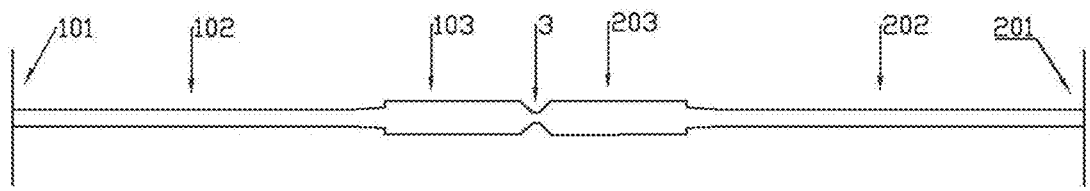
FIG. 1(a) is the top-view drawing of a tunable semiconductor laser in accordance with one embodiment of the present invention.

FIG. 1(a) shows the top-view drawing of a tunable semiconductor laser based on half-wave coupled partial reflectors in accordance with one embodiment of the present invention. The laser is composed of two optical resonant cavities. One resonant cavity comprises an optical waveguide 102 bounded by reflecting element 101 and reflecting element 103. The other resonant cavity comprises an optical waveguide 202 bounded by reflecting element 201 and reflecting element 203. The two optical resonant cavities are connected through a short coupling waveguide 3.

The reflecting element 103 and 203 are partial reflectors with certain transmissivity and reflectivity. The incident light will partly be reflected back to origin resonant cavity and partly transmitted into another resonant cavity. The reflecting elements 101 and 201 serve asoutput ports. The incident light will partly be reflected back to origin resonant cavity and partly be coupled into the fiber probe.

Figure 1B:
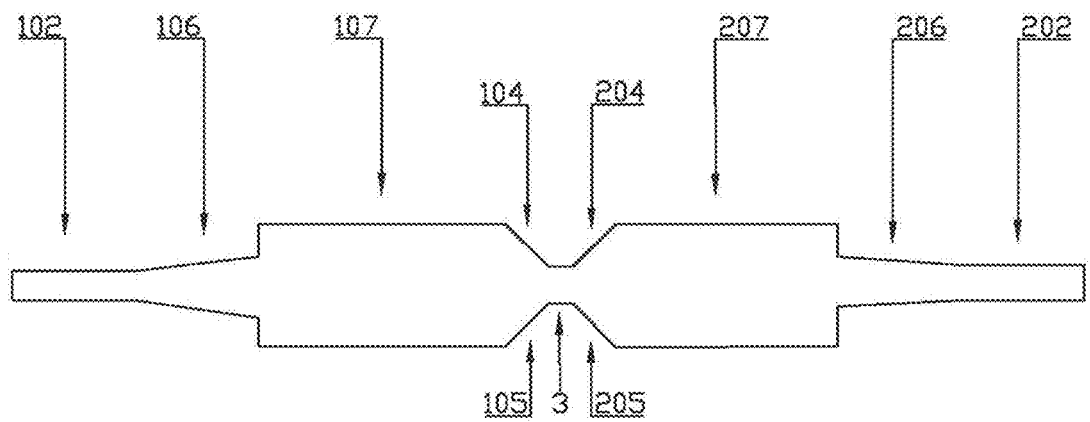
FIG. 1(b) is the local enlarged top-view drawing of the coupler section in accordance with one embodiment of the present invention.

The reflecting elements 103 and 203 are back-to-back connected through a short coupling waveguide 3 and form a bow-tie shaped coupler. This is the key structure to achieve an optimal single-mode selectivity of the laser. FIG. 1(b) shows the top view of the bow-tie coupler in accordance with one embodiment of the present invention. In this embodiment, the reflecting element 103 is composed of transitional waveguide 106, multimode waveguide 107, TIR corner mirrors 104 and 105. The reflecting element 203 is composed of transitional waveguide 106, multimode waveguide 107, TIR corner mirrors 104 and 105.

Figure 2:
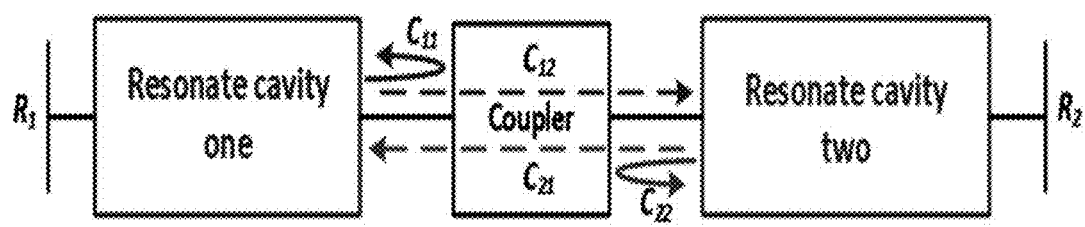
FIG. 2 is the schematic layout diagram of a typical coupled cavity laser.

FIG. 2 shows the schematic layout of a typical coupled cavity laser. The laser is composed of two resonant cavities connected through a coupler. The two resonant cavities should have different optical lengths so that there is only one common resonate frequency in material spectral gain window. The common resonate frequency determines the main output longitude mode of laser. In order to achieve single mode emission, we need a mode selection mechanism to suppress the misaligned mode and the coupler could achieve this function by establishing certain coupling relation between two resonant cavities. Moreover, if the coupler has good mode-selection ability, the length difference between two resonant cavities could be small (e.g. less than 10 percent). Therefore, the tuning range of laser can be greatly improved through the Vernier effect.

Figure 3:
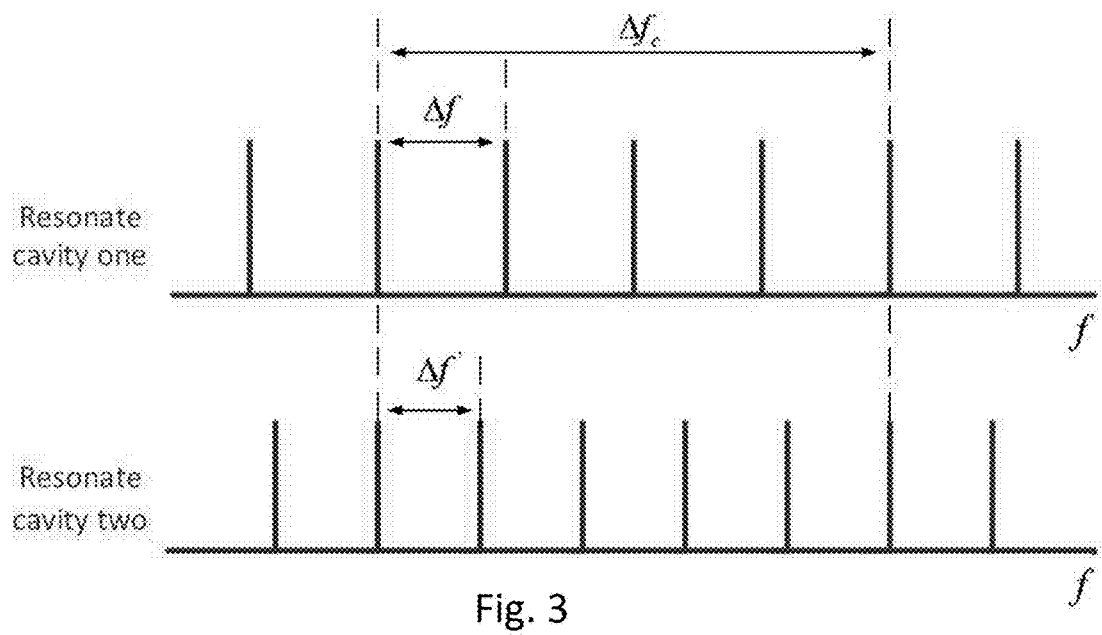
FIG. 3 is a schematic diagram showing the relationships between the two sets of resonant peaks of two resonant cavities.

The principle of the Vernier effect is illustrated in FIG. 3. In this instance of the present invention, the optical length of the resonant cavity one (total optical length including optical waveguide 102 and reflecting element 103) is chosen on the principle that its resonance frequency interval matches the spacing of the operating frequency grid, an example being the widely used frequency grid defined by ITU (e.g. spaced at 200 GHz, 100 GHz or 50 GHz). The resonance frequency interval is determined by $$\Delta f = \frac{c}{2(n_{11}L_{11} + n_{12}L_{12})}$$

In the formula, $L_{11}$ and $L_{12}$ are the lengths of the optical waveguide 102 and the reflecting element 103; $n_{11}$ and $n_{12}$ are the effective refractive index of optical waveguide 102 and the reflecting element 103, respectively.

Similarly, the resonance frequency interval of the resonant cavity two (including optical waveguide 202 and reflecting element 203) is determined by $$\Delta f' = \frac{c}{2(n_{21}L_{21} + n_{22}L_{22})}$$

In the formula, $L_{21}$ and $L_{22}$ are the lengths of optical waveguide 202 and the reflecting element 203; $n_{21}$ and $n_{22}$ are the effective refractive index of optical waveguide 202 and the reflecting element 203, respectively.

The resonance frequency interval Δf of the resonant cavity two is chosen to be slightly different to Δf so that only one resonant peak coincides with one of the resonant peaks of the resonant cavity one over the material spectral gain window, as shown in FIG. 3. The distance between two aligned resonant peaks, which corresponds to the free spectral range (FSR) of the combined cavity, is determined by $$\Delta f_c = \frac{\Delta f \Delta f'}{|\Delta f - \Delta f'|}$$

In case two wavelengths lasing simultaneously, $\Delta f_c$ should generally be larger than the spectral width of the material gain window.

By changing the refractive index of one of the waveguides, the resonant frequency of this cavity changes; thus the coincidence frequency of the two resonant cavities changes, and the operating frequency of the laser switches to another channel. Since the operating frequency of the laser is the coincidence frequency of the two resonators, a small frequency shift δf" in the resonant peaks of one resonant cavity results in a jump of a channel in the laser frequency. Therefore, the tuning range of the laser frequency with the refractive index variation is amplified by a factor of Δf/|Δf−Δf'|, i.e.

$$\delta f = \frac{\Delta f}{|\Delta f - \Delta f'|} \delta f'$$

The increased tuning range is one of the advantages of this kind of coupled-cavity laser. Considering an example in which Δf=100 GHz, and Δf=90 GHz, the range of the laser frequency variation is increased by a factor of 10 with respect to what can be achieved by the refractive index variation directly.

The coupled-cavity structure of the present invention allows an optimal amount of light to be coupled from one cavity to the other (i. e. cross-coupling), while the remaining light to be coupled back to the same cavity (i. e. self-coupling). As a result, much higher single-mode selectivity can be achieved. We could analyze the mode selectivity through the threshold equation.

Referring to FIG. 1(a) and FIG. 2, the amplitude reflectivities of the reflecting elements 101 and 201 are assumed as $r_1$ and $r_2$, respectively. The coupling between the waveguides occurs through the reflecting elements 103, 203 and the coupling waveguide 3. We denote the amplitude coupling coefficients from the waveguide 102 to the waveguide 202 (cross-coupling), from the waveguide 102 back to the waveguide 102 (self-coupling), from the waveguide 202 to the waveguide 102 (cross-coupling), and from the waveguide 102 back to the waveguide 102 (self-coupling), as $C_{12}$, $C_{11}$, $C_{21}$ and $C_{22}$, respectively. For simplicity, we assume there is no excess coupling loss. Therefore, we have $|C_{11}|^2 + |C_{12}|^2 = 1$ and $|C_{21}|^2 + |C_{22}|^2 = 1$. The threshold condition for the laser can then be written as $$r_1 r_2 \left( C_{11} + \frac{C_{21} C_{12} r_1 r_2 e^{2(g' + ik')L'}}{1 - C_{22} r_1 r_2 e^{2(g' + ik')L'}} \right) e^{2(g + ikL)} = 1$$

In the formula, k and g are a propagation constant and a gain coefficient of the optical waveguide 102; k' and g' are a propagation constant and a gain coefficient of the optical waveguide 202; i is the imaginary number, and L is the optical length of the first resonant cavity one; and L' is the optical length of the second resonant cavity.

But in practice, the coupler which connects two resonant cavities inevitably induces excess coupling loss. We use the normalized intensity coupling coefficient χ in order to eliminate the influence of coupling loss. X is defined as:

$$\chi = \frac{|C_{21}|^2}{|C_{11}|^2 + |C_{21}|^2} = \frac{|C_{12}|^2}{|C_{12}|^2 + |C_{22}|^2}$$

Figure 4:
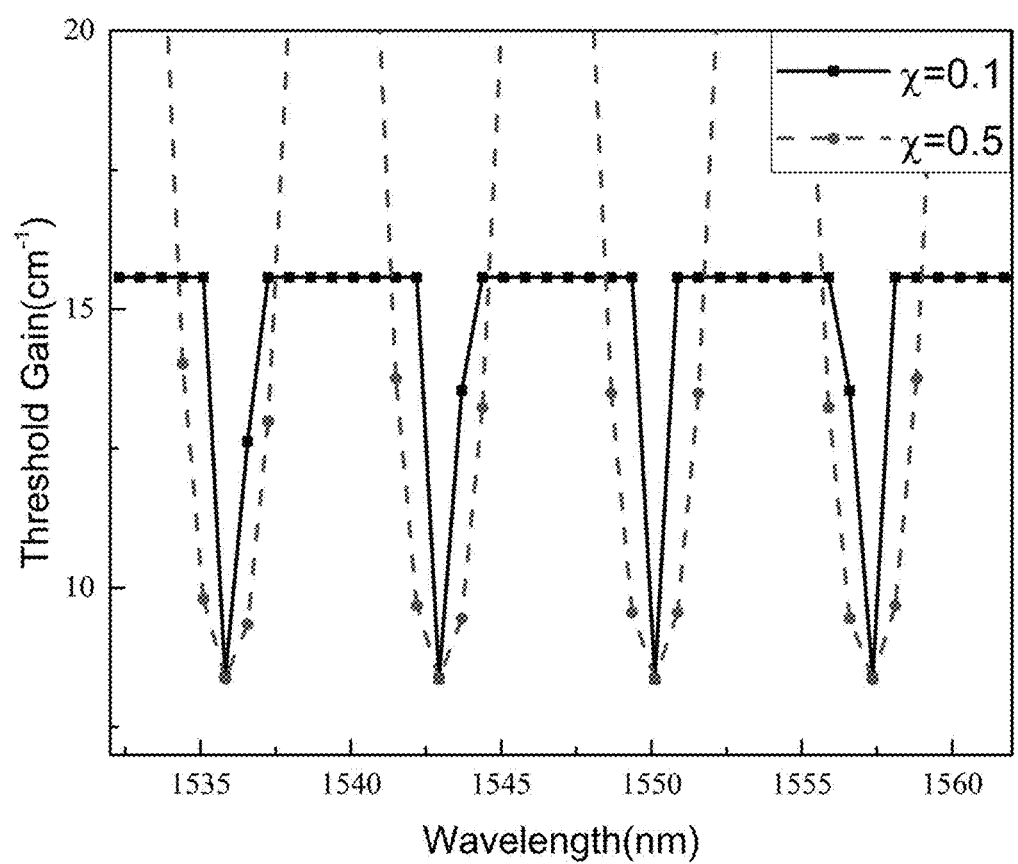
FIG. 4 is the threshold gain of each modes near 1550 nm when the normalized intensity coupling coefficient are 0.1 and 0.5.

Now we use a numerical example to illustrate the characteristics of the coupled-cavity laser. Consider an example where n=n'=3.215, L=466 μm, and L'=518.31 μm (i. e. with 5% length difference). The two cavities have a common resonance wavelength near 1550 nm. FIG. 4 shows the threshold gain G of each modes near 1550 nm when the normalized intensity coupling coefficient are 0.1 and 0.5, respectively. When the normalized intensity coupling coefficient is 0.1, the mode with the lowest threshold appears at 1550 nm where the two cavity resonance peaks coincide. The threshold difference between this mode and the side mode with second lowest threshold is about 7.2 $cm^{-1}$. As contrast, when the normalized intensity coupling coefficient is 0.5, the difference between two modes is only 1.2 $cm^{-1}$. So for the coupled-cavity laser with 5% length difference, in order to achieve better mode selectivity, the normalized intensity cross-coupling coefficient of the coupler should be less than 0.1. Using this method, we could also calculate the best normalized intensity coupling coefficient for the coupled-cavity laser with arbitrary length difference.

Figure 5:
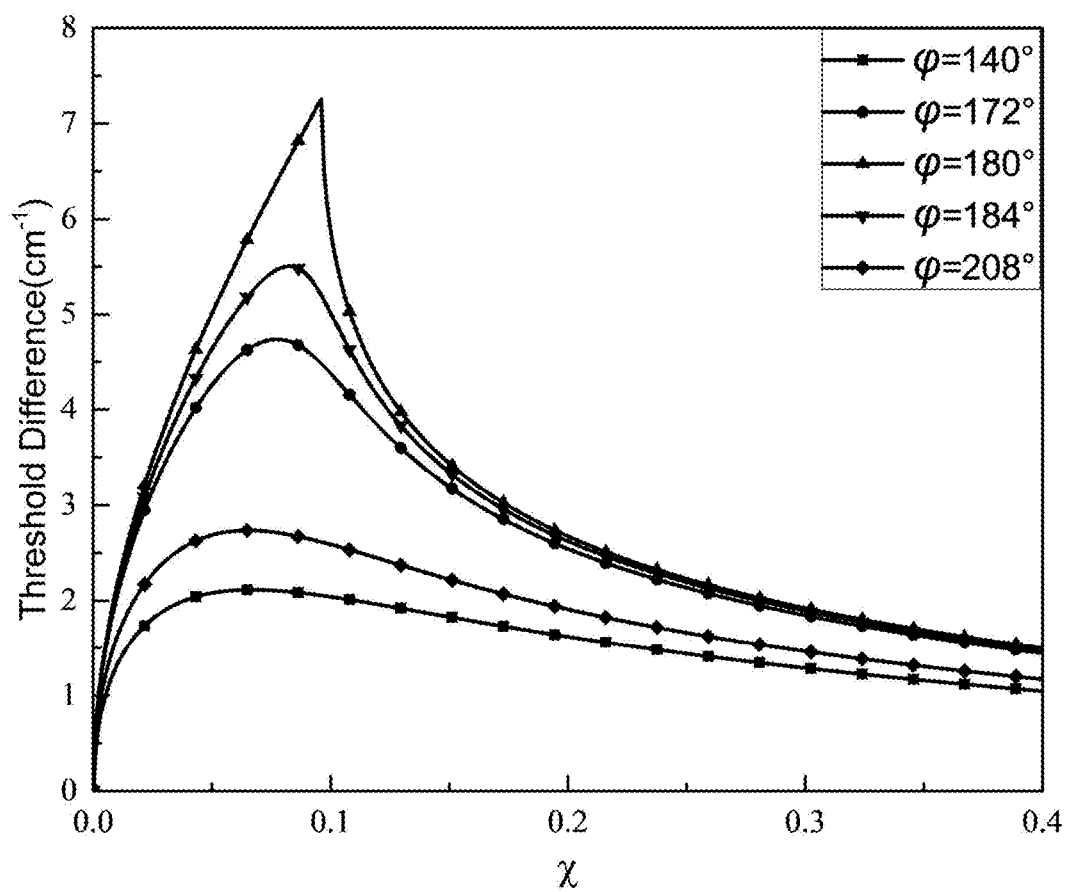
FIG. 5 is the threshold gain difference between the lowest threshold mode and the next lowest threshold mode as a function of the normalized intensity cross-coupling coefficient under different phase difference.

For the coupled-cavity laser, the phase difference between cross-coupling and self-coupling also has an important effect on the single-mode selectivity of laser. FIG. 5 shows a threshold gain difference between the lowest threshold mode and the next lowest threshold mode as a function of the normalized intensity cross-coupling coefficient under different phase difference. It can be concluded that, when the relative phase difference near odd multiples of π, the laser acquires the best mode selectivity.

To form the resonant cavity discussed above, we need at least one waveguide bounded by two reflection elements to form a Fabry-Perot resonant cavity. As shown in FIG. 1(a), the reflecting elements 101 and 201 can all serve as an output port. They need to reflect part of light back to original resonant cavity and transmit the residual light to the receiving equipment. The simplest structure to achieve such function is a cleavage facet which could provide the reflectivity near 30%. The cleavage process is simple and can form a perfect reflection mirror. However, the cleavage precision (about several microns) may limit the repeatability of laser because the length of each cavity has great influence on the performance of coupled-cavity laser. We could use a deep-etched air surface to replace the cleavage facet. The advantage of deep-etched air surface is that it can precisely control the length of resonant cavity, while the disadvantage is that the etching quality may influence its reflectivity. Moreover, if we just need one output port, the other reflection element can be coated with a thin layer of metal high-reflection coating. When applied on integrated platform, the reflecting elements 101 and 201 can be other types of on-chip partial reflector, such as deep-etched trench, and connect with other devices.

The most important structure of laser is the coupler which could control the coupling relation between two cavities. In the present invention, we use the reflecting elements 103 and 203 to precisely control the intensity coupling coefficient of cross-coupling and self-coupling. A short coupling waveguide 3 is connected between two reflecting elements to control the relative phase difference between cross-coupling and self-coupling.

To achieve relative good performance, we need the reflecting element 103 and 203 to have a wide adjustable range of reflectivity and transmissivity. Traditional on-chip reflecting elements such as deep-etched slot or distributed Bragg reflector can achieve such function, but they are not applicable to this structure for their high fabricated difficulty. In the present invention, we exploit a novel on-chip integrated partial reflector based on TIR corner mirror group and central output port.

For a regular single mode symmetrical waveguide, the fundamental mode is also symmetrically distributed and can be approximated by a Gaussian field. In order to partially reflect the incident light back, a simple method is to deeply etch two sides of the waveguide and form air reflection surface. Thus, the light near the edge of the waveguide will reflect back, while the light near the central portion will continue to propagate forward. According to the Fresnel formula, if the light perpendicularly comes into the air surface from the material with refractive index n, the reflectivity is as follows: $R=(n-1)^2/(n+1)^2$. However, for commonly used optical waveguide materials, such as silicon, silica and III-V semiconductors, the reflectivity is relatively small (less than 30%). The low reflectivity may induce large loss. In order to decrease the loss, high-reflector coating can be used to increase the reflectivity. A simple way to form optical coating is to sputter a thin layer of metal. For example, a thin layer of gold can give very large reflectivity (larger than 98 percent) throughout the near-infrared spectral range. However, the extra metal coating process can increase the fabrication difficulty, and the thickness and density of metal coating may influence the reflectivity which is very important when forming a coupler.

Figure 6:
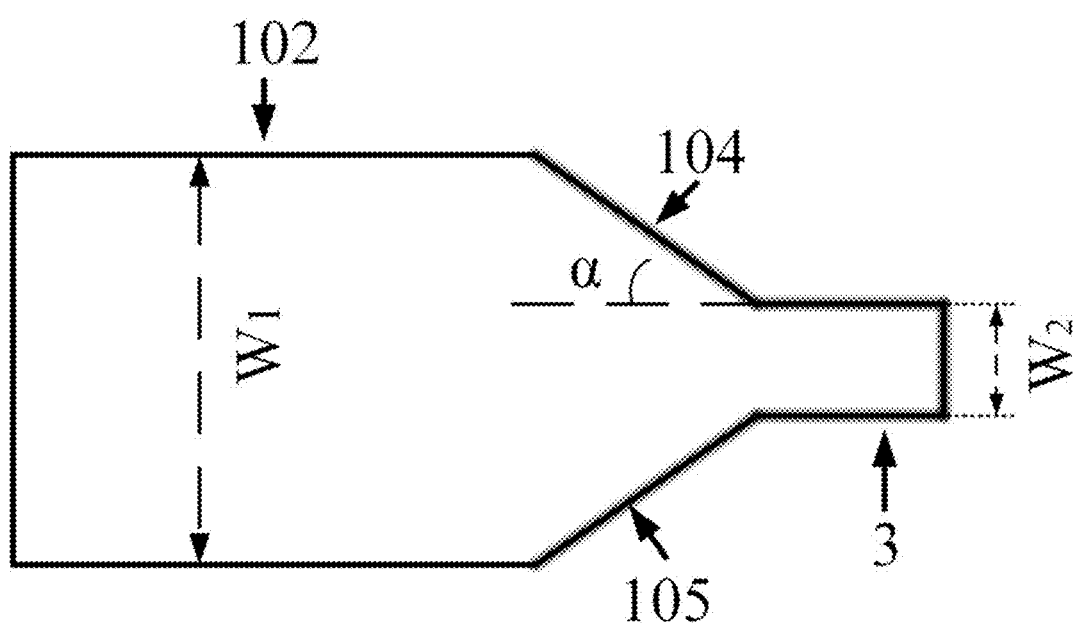
FIG. 6 is the fundamental structure of the partial reflector based on central transmissive TIR corner mirror group.

So in the present invention, instead of a vertical air reflection surface, we exploit the principle of total internal reflection to achieve high reflector. FIG. 6 shows the most fundamental structure of the partial reflector. It is composed of at least an input waveguide 102, an output waveguide 3 and a central transmissive mirror group. The central transmissive TIR corner mirror group is composed of two TIR corner mirrors 104 and 105, and a central transmissive region 306. In order to minimize the reflection loss, the TIR corner mirrors are not vertical to the incident light, instead, they are with an angle of 45 degrees to the direction of the input light. Both of them are total internal reflection mirrors. So the edge part of incident light will return to the original waveguide after two total reflections, while the central part of incident light will pass through the central transmissive region and propagate into the output waveguide. For the materials mentioned above, the critical angle of total reflection is much smaller than 45°, so this structure is theoretically lossless.

However, this fundamental structure is not applicable on most integrated platform. On the one hand, the reflectivity and transmissivity are determined by the widths of input and output waveguides which are fixed for most components. On the other hand, in reality, the optical waveguide is generally too narrow (e.g. less than 3 μm for III-V semiconductors), so that the structural rounded corner and rough sidewall due to limited lithographic resolution and etching quality may induce great loss.

In order to increase the design flexibility and decrease the fabrication difficulty of structure, we introduce a beam expander between the input waveguide and the central transmissive TIR corner mirror group. The function of beam expander is to expand the width of input optical mode. A simple and available structure to achieve such function is a reverse tapering waveguide. An optical waveguide with a gradual increase in width could expand the first-order mode without mode conversion to higher-order modes.

Figure 7:
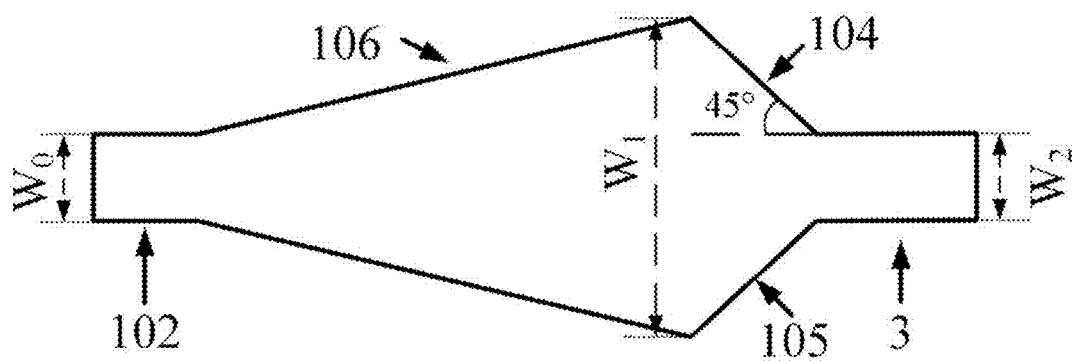
FIG. 7 is the partial reflector based on linearly reverse tapering waveguide and central transmissive TIR corner mirror group.

FIG. 7 shows one embodiment of a partial reflector with a beam expander. A reverse tapering waveguide 106 is inserted between the input waveguide 102 and the central transmissive TIR corner mirror group which is composed of two TIR corner mirrors 104 and 105. For the taper whose width increases with length linearly, a simple rule can be used to design the taper in order to effectively confine the first-order mode. The rule requires that the increasing velocity of the waveguide width be slower than the diffraction spreading velocity of the first-order mode. So the size of taper should satisfy the equation $$\theta < \frac{\lambda_0}{2W_m n_{\it eff}}$$

In the formula, $\theta$ is the half angle of the taper; $\lambda_0$ is the wavelength in vacuum; $W_m$ is the maximum full width of taper; and $n_{\it eff}$ is the effective refractive index of the first-order mode. The rule requires that for a tapering waveguide with defined width change must be long enough to reduce the mode loss. In practical application, many other designs of tapering waveguide have been proposed and demonstrated to be effective on reducing the length under lossless condition, including exponential, parabolic, and Gaussian expansion types. Some taper with irregular expansion type based on simulation result can be used to achieve ultra-short lossless taper, too.

Figure 8:
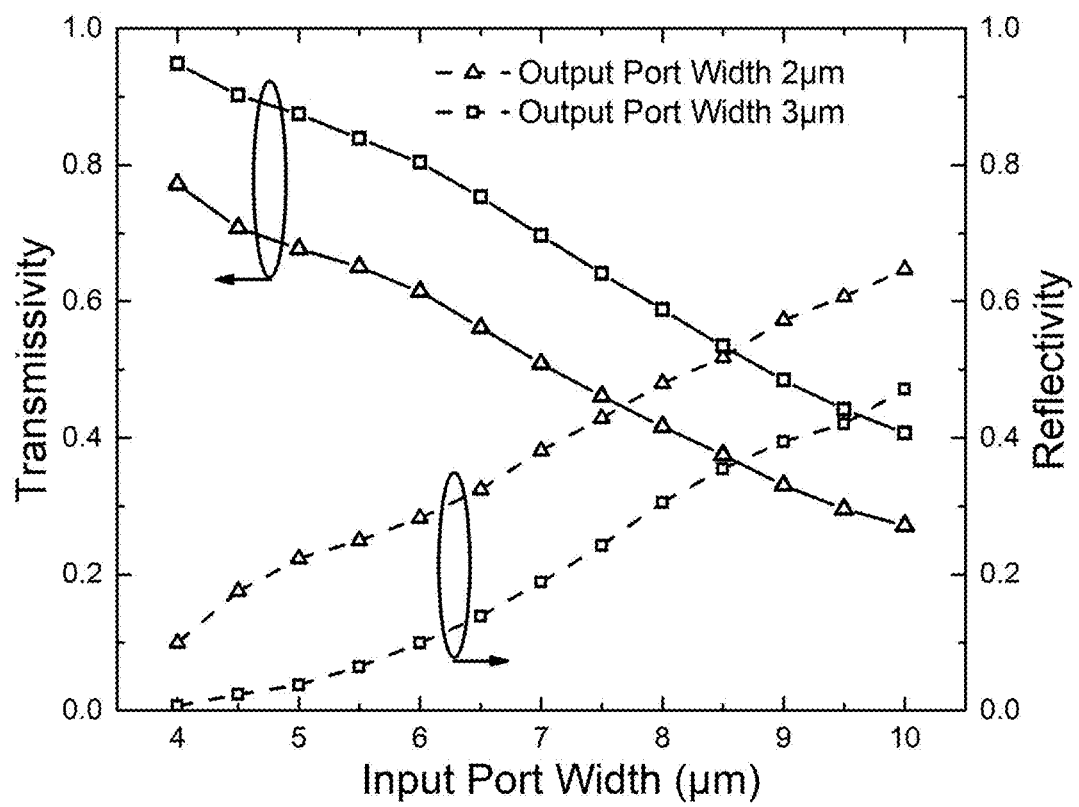
FIG. 8 is the reflectivity and transmissivity of the partial reflector shown in FIG. 6 as the function of the right end width of tapering waveguide $W_1$ under different output waveguide width $W_2$.

To simplify the design and illustrate the function of central transmissive TIR corner mirror group, we use a linear tapering waveguide in the embodiment as shown in FIG. 7. We set the width of input waveguide to 3 μm and the length of taper to 50 μm, and then simulate the reflectivity and transmissivity of partial reflector as the function of right end width of tapering waveguide $W_1$ under different output port widths $W_2$. The results are shown in FIG. 8. Merely by changing the right end width of tapering waveguide, this structure can achieve arbitrary reflectivity and transmissivity with relatively low loss. As the result in FIG. 8 shows, the loss varies from 0.05 to 0.15. Most of loss is induced by the deviation of reflected light from fundamental mode. In practical application, the shape of tapering waveguide can be further optimized to reduce the mode loss.

Figure 9:
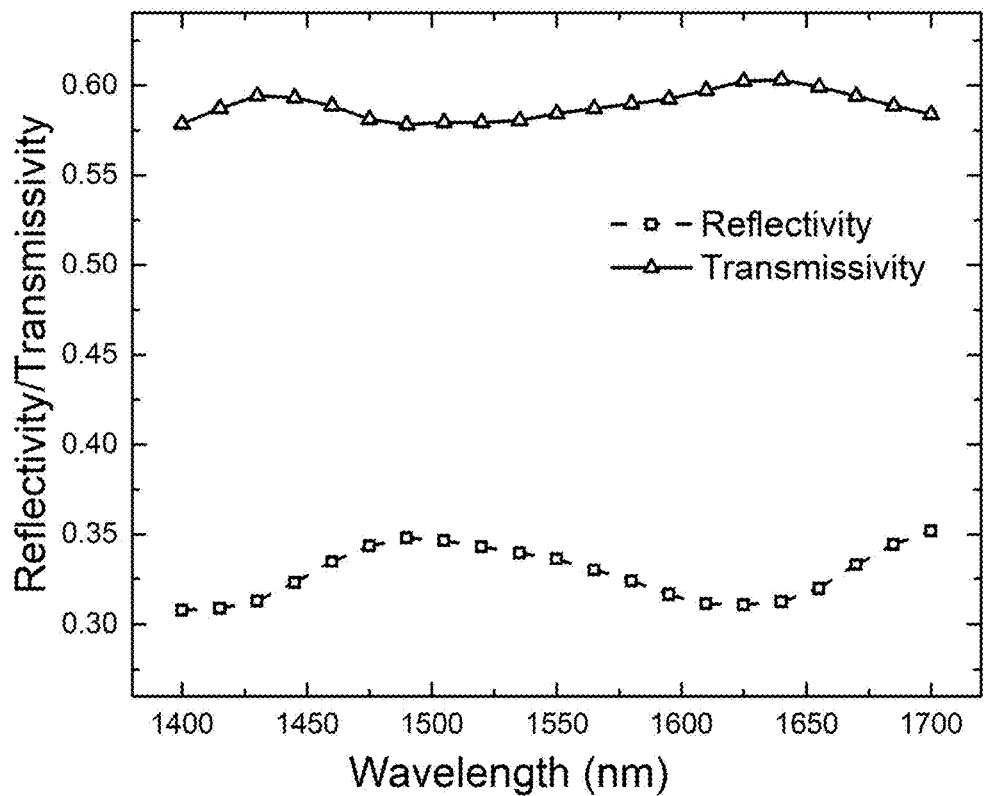
FIG. 9 is the reflectivity and transmissivity of the partial reflector shown in FIG. 6 as the function of the optical wavelength.
Figure 10:
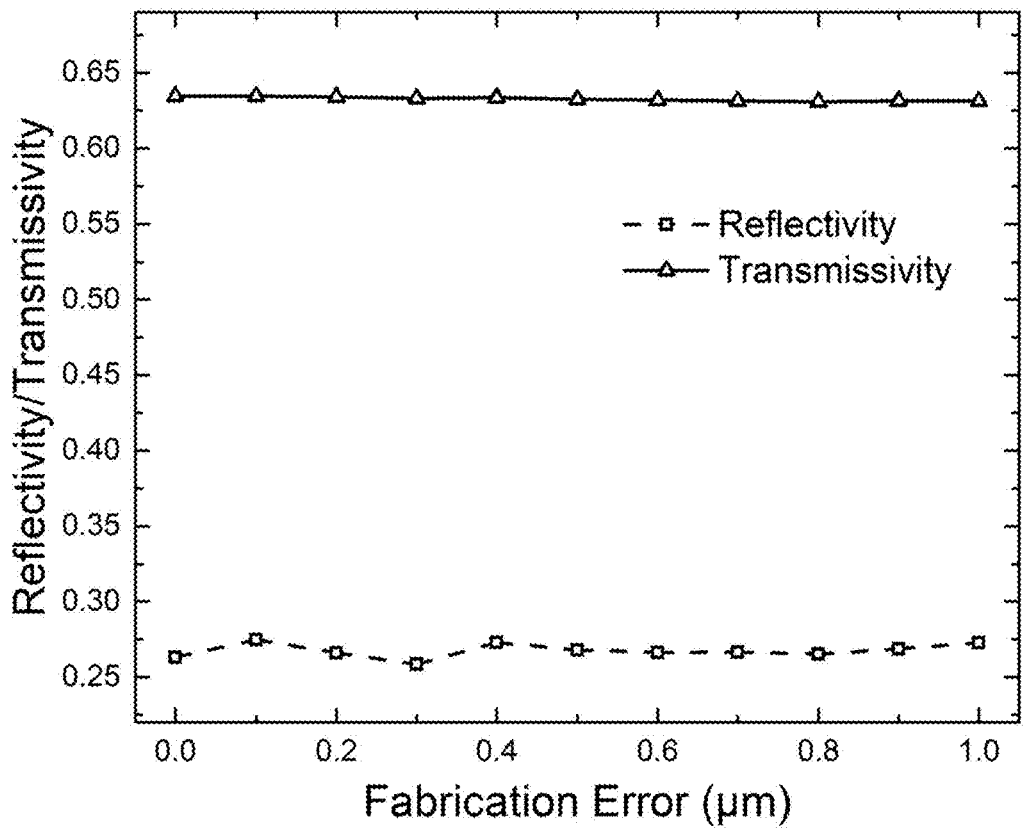
FIG. 10 is the reflectivity and transmissivity of the partial reflector shown in FIG. 6 as the function of the fabrication error caused by the misalignment of deep-etching area along waveguide direction.

Since the tapering waveguide beam expander is based on the gradual change of input light field, this kind of partial reflector has very low wavelength sensitivity. As shown in FIG. 9, in a large wavelength range of 300 nm, the changes of transmissivity and reflectivity are all less than 0.05. Another advantage of the present invention is its much higher fabrication tolerance. The main fabrication error of this structure is the error caused by the misalignment of the deep etching area along the waveguide direction. FIG. 10 shows therelations of transmissivity and reflectivity versus fabrication error along waveguide direction. The transmittance and reflectivity shows almost no change when the etching position deviates one micron, and such fabrication error can be controlled easily in practical application.

A disadvantage of the embodiment of FIG. 7 is that, after the beam expansion through tapering waveguide, the optical field still satisfies approximately Gaussian distribution. Most of the light field energy concentrates on the center of waveguide. When low transmissivity and high reflectivity are required, there are two solutions: increasing the right end width of tapering waveguide $W_1$ or decreasing the output waveguide width $W_2$. For the first solution, the length of tapering waveguide must be particularly large in order to achieve lossless mode expansion, which may increase the size of total structure. For the second solution, the output waveguide must be much narrower, thus it increases the fabrication difficulty. Besides, as most light energy is concentrated on the center, the fabricated rounded corner between the TIR corner mirrors 104 and 105 may induce large radiation loss.

For the half-wave coupler mentioned above, in order to get optimum mode selectivity, the normalized intensity cross-coupling coefficient of the coupler should be less than 0.1. If we assume the partial reflector is lossless, its transmissivity should be less than 0.1, too. Then the partial reflector with tapering waveguide working as mode expander is not perfectly applicable to this case. Therefore, we use another type of mode expander which is more suitable for application needing low transmissivity.

Figure 11:
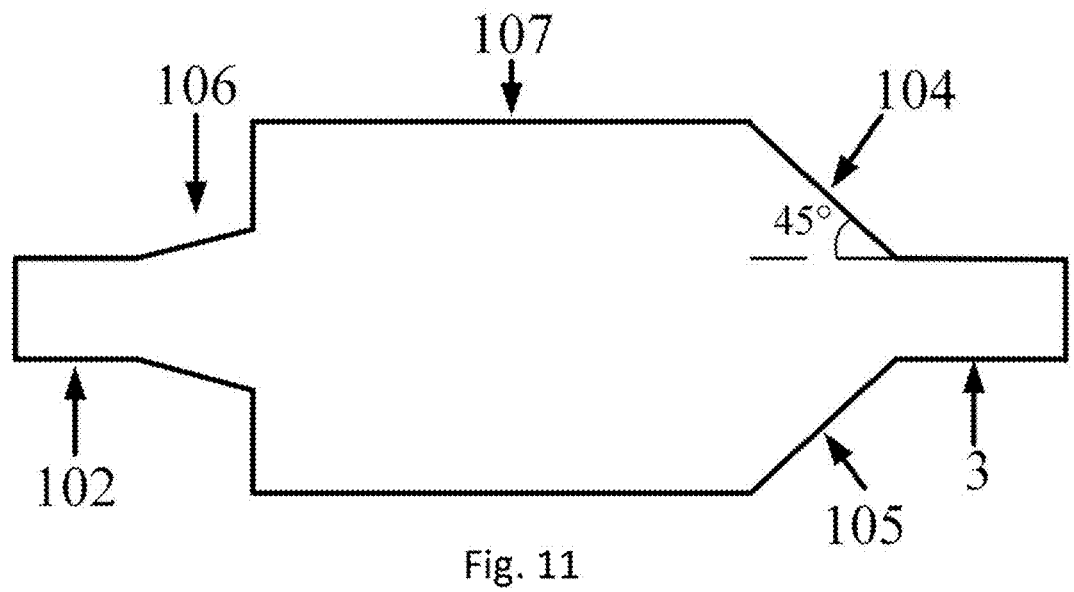
FIG. 11 is the partial reflector based on transitional waveguide, multimode waveguide and central transmissive TIR corner mirror group.

FIG. 11 shows one embodiment of a partial reflector with another type of beam expander. The beam expander is composed of a transitional waveguide 106 and a multimode waveguide 107 connected between an input waveguide 102 and a central transmissive TIR corner mirror group which is composed of two TIR corner mirrors 104 and 105. This type of beam expander is based on the same principle as multimode interference (MMI) coupler. The multimode waveguide can be used to produce multiple images through self-imaging effect formed by the interference between higher order modes. 1×N Beam splitters based on MMI coupler have been maturely applied on various optical integrated platforms. The advantage of MMI coupler is that it can accurately achieve arbitrary splitting ratio with low loss.

For our structure, we need the multimode waveguide to expand the input optical mode and form at least three images at output port. The light near center will transmit into output waveguide and residual light will reflect back to original waveguide. For multimode waveguide, there are several options to achieve 1×N beam splitting, including general interference mode, restricted interference mode and symmetric interference mode. Among these structures, the symmetric interference mode has the shortest length when having the same imaging result. It also has the simplest imaging principle and design process. So in the present invention, we use a symmetric interference multimode waveguide as the beam expander, which means that the input waveguide is in the center of multimode waveguide.

For the multimode waveguide, once the position of input waveguide is fixed, the output light distribution is determined by its length and width. Using modal propagation analysis (MPA) method can acquire the light field distribution at different position. For the light propagating in the multimode waveguide, the effective width of guided-mode is approximately equal to that of fundamental mode, which can be calculated as $$W_{ev} \approx W_{mmi} + \frac{\lambda}{\pi}(n_r^2 - n_c^2)^{-\frac{1}{2}}$$

In the formula, $W_{mmi}$ is the width of multimode waveguide; $n_f$ is the effective index of waveguide core layer; $n_c$ is the effective of waveguide cladding; and $\lambda$ is the wavelength in vacuum. For symmetric interference mode, there will be N reconstructed images when the length of multimode waveguide $$L_{mmi} \approx \frac{3L_\pi}{4N},$$

where $L_z$ is the beat length between fundamental mode and first-order guided mode $$L_\pi \approx \frac{4n_r W_{ev}^2}{3\lambda}$$

Figure 12:
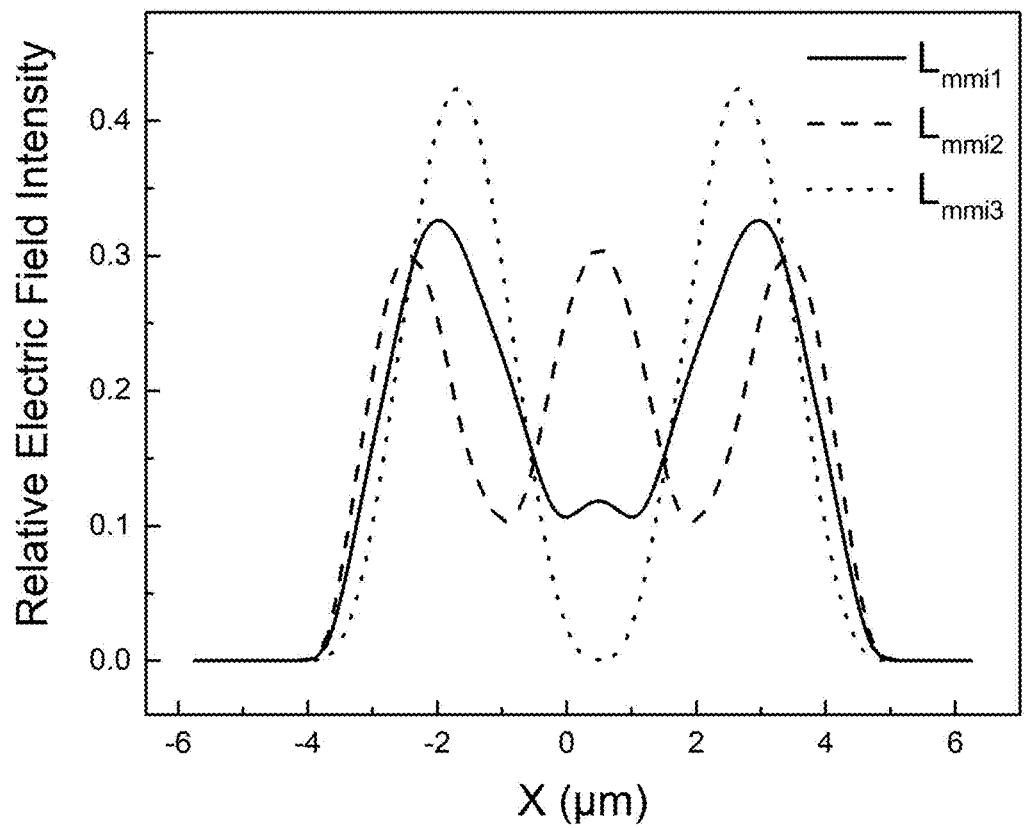
FIG. 12 is the light field distribution at output port under different multimode waveguide length.

When applied to partial reflector based on the central transmissive TIR corner mirror group, the multimode waveguide should expand the beam to at least three parts. Considering to minimize the size of structure, the width of multimode waveguide should not be too wide (2~3 times the width of input waveguide is suitable). As the partial reflector in the present invention needs low transmissivity and high reflectivity, the length of multimode waveguide should better be between standard 1×3 MMI coupler and 1×2 MMI coupler. In real application, the reflectivity and transmissivity depend on the specific distribution of light field, which could be simulated through beam propagation method (BPM) or finite difference time domain algorithm. FIG. 12 shows the light field distribution at output port under different multimode waveguide length simulated through 2.5-dimentional FDTD method. In the formula, $L_{mmi2}$ and $L_{mmi3}$ are lengths of standard 1×3 and 1×2 MIMI coupler, respectively. $L_{mmi1}$ is the needed length and satisfies the condition $L_{mmi2}<L_{mmi1}<L_{mmi3}$. As FIG. 12 shows, the multimode waveguide with length of $L_{mmi1}$ could split the input light into three parts and the central part has the relatively low field intensity. One potential problem of this structure is that since the central part of light transmits into output waveguide, the light reflected back may deviates from fundamental mode. Therefore, we induce a transitional waveguide 309 between the input waveguide and the multimode waveguide so as to eliminate the mode mismatch.

Figure 13:
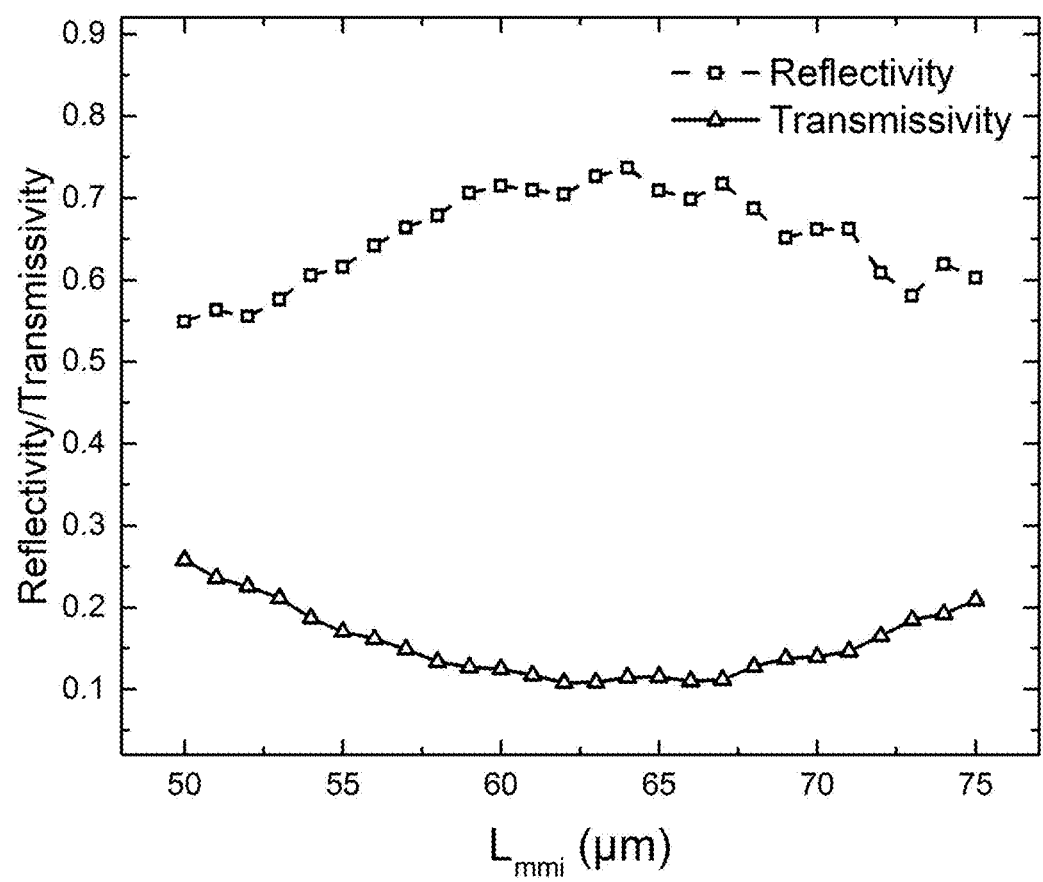
FIG. 13 is the reflectivity and transmissivity of the partial reflector as the function of the length of multimode waveguide Lmmi.

Using an FDTD method, we simulate the transmissivity and reflectivity under different multimode waveguide lengths $L_{mmi}$. As shown in FIG. 13, once the widths of multimode waveguide and output waveguide are fixed, the transmissivity changes slightly with a multimode waveguide length, which provides a precisely way to control the performance of partial reflector. As $L_{mmi}$ changes from 50 μm to 75 μm, the transmissivity varies from 0.1 to 0.25 and the loss of fundamental mode varies from 0.1 to 0.2. Optimizing the shape of transitional waveguide can further reduce the extra loss due to mode mismatch.

Similar to MMI coupler, the partial reflector based on multimode waveguide and central transmissive TIR corner mirror group shows high fabrication tolerance, design freedom and wavelength insensitivity. It is an optimal choice to form half wave coupler. In FIG. 1b we use this type of partial reflector to further illustrate the present invention. Two partial reflectors are back-to-back arranged in a line and their output ports are connected through the coupling waveguide 3 as shown in FIG. 1b. The transmissivity and reflectivity of the reflecting elements 103 and 203 determine the amplitude coupling coefficient between two resonant cavities. Using BPM, FDTD or other simulation algorithms, we can simulate the coupling relationship of the coupler.

Figure 14A:
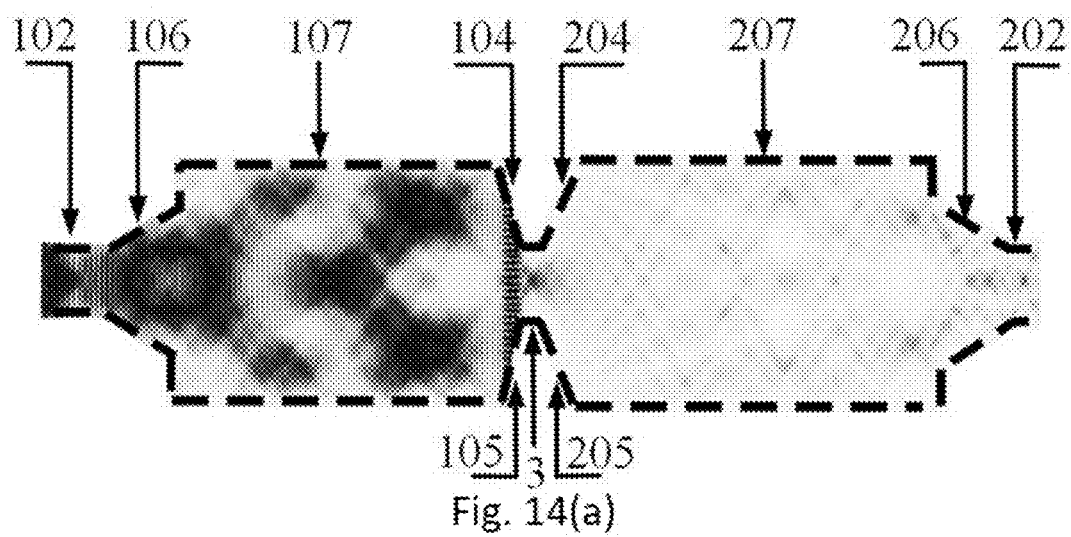
FIG. 14(a) is the FDTD simulation result of half-wave bow-tie coupler with TIR corner mirror reflection.
Figure 14B:
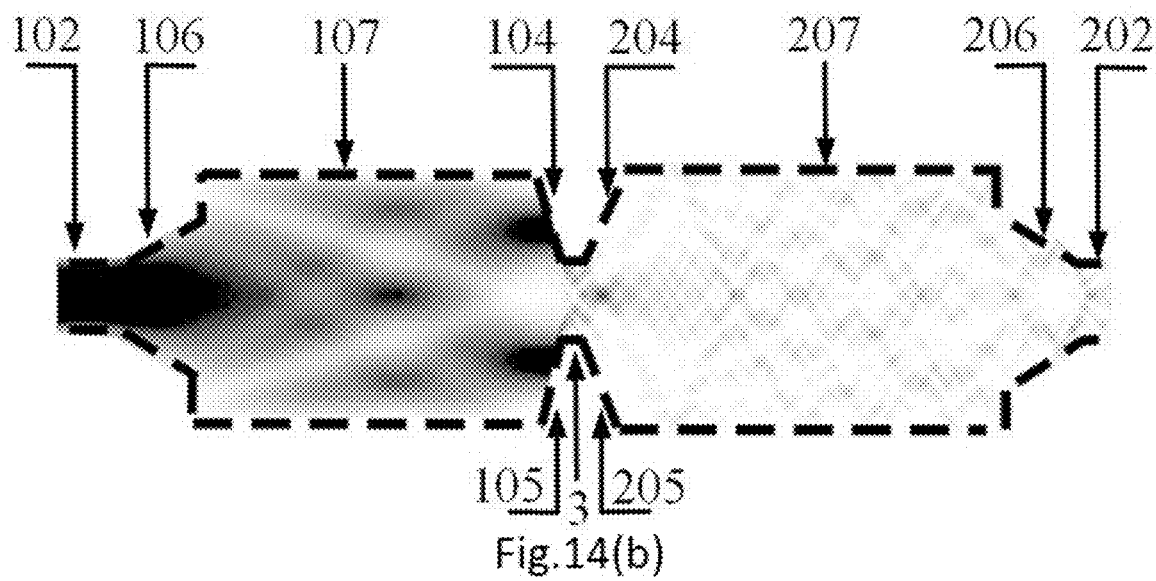
FIG. 14(b) is the FDTD simulation result of half-wave bow-tie coupler without TIR corner mirror reflection.

In the present invention, we use a 2.5-dimensional FDTD method to simulate the needed parameters of the coupler. Based on the symmetrical characteristic of the structure, we set the reflecting element 103 and 203 withthe same shapes. FIG. 14 (a) shows the simulation result of energy transmission inside the bow-tie coupler. The light source is located at the optical waveguide 102. The optical field in the multimode waveguides 107 and F exhibits interference pattern due to forward and backward reflected waves. FIG. 14(b) shows the field distribution when the back reflection is artificially removed by adding an absorption layer at the TIR corner mirrors 104 and 105. The double-lobed field distribution is clearly seen near the middle of each TIR corner mirror. A small portion of the light is transmitted through coupling waveguide 3 to the other resonant cavity.

Figure 15:
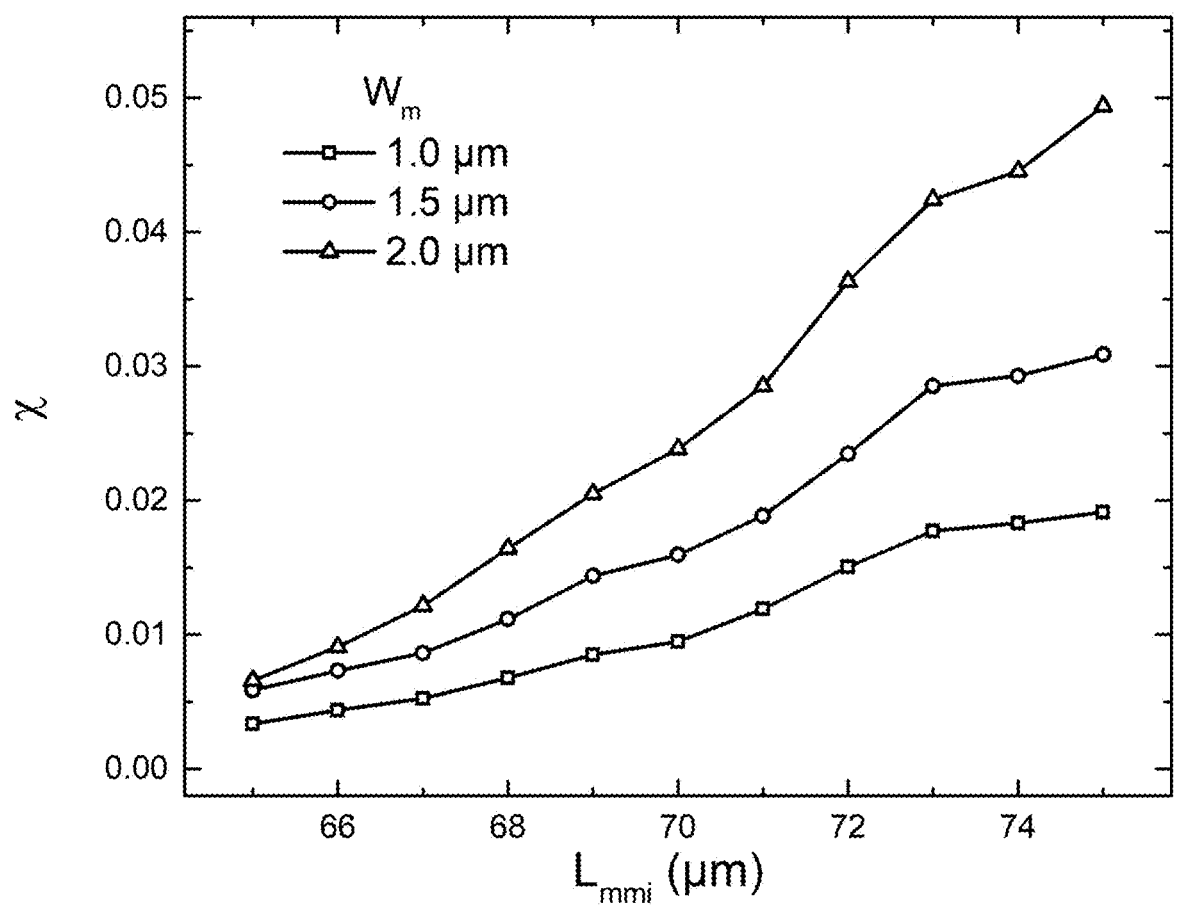
FIG. 15 is the normalized intensity coupling coefficient χ as the function of the length of multimode waveguide under different widths of coupling waveguide.

As discussed above, the intensity coupling relation is mainly determined by three parameters, the width of multimode waveguide $W_{mmi}$, the length of multimode waveguide $L_{mmi}$ and the width of coupling waveguide $W_m$. In order to simplify the design process, we fix the $W_{mmi}$ and two-dimensionally scan $L_{mmi}$ and $W_m$. To eliminate the influence of loss, we calculate the normalized intensity coupling coefficient $\chi$ mention before and the simulation results are shown in FIG. 15. As shown, we can precisely acquire the optimal intensity coupling relation to achieve high mode selectivity for certain resonant cavity length difference.

Figure 16:
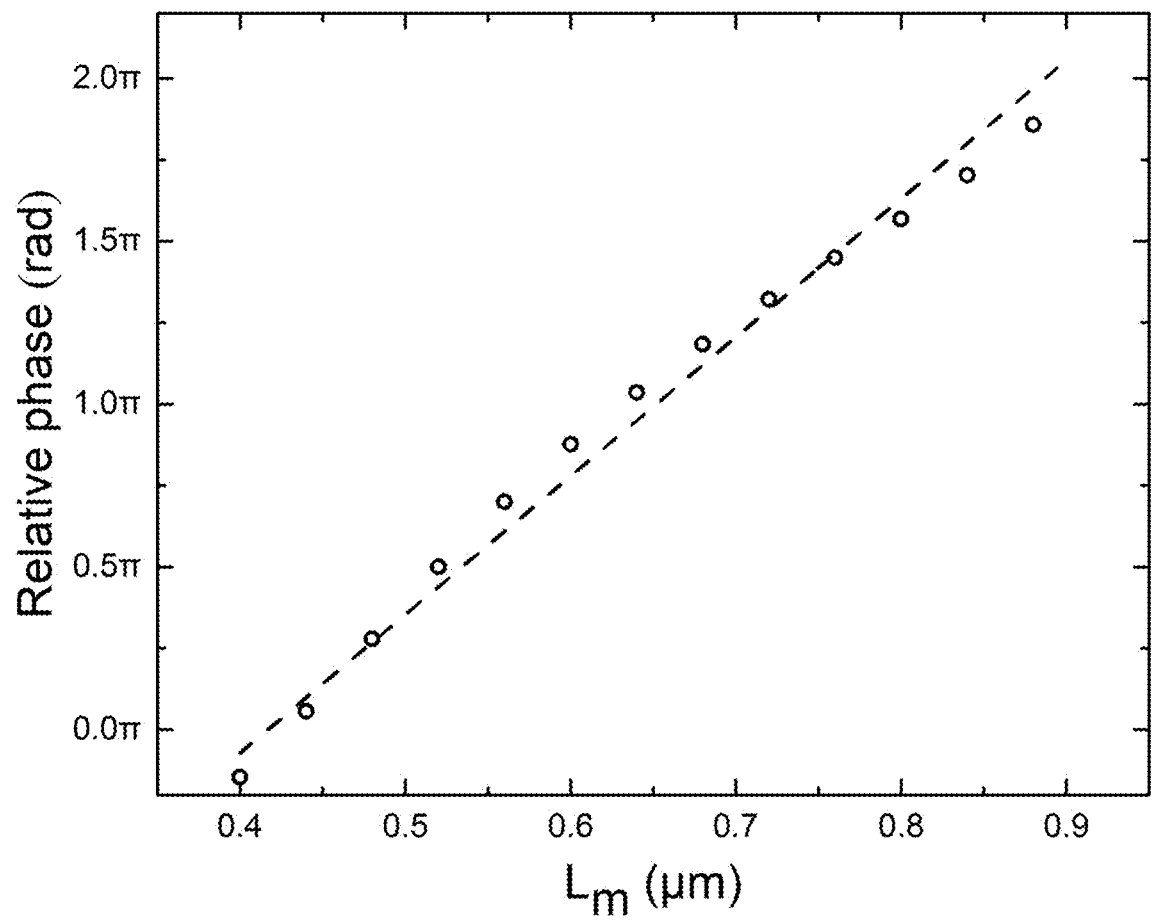
FIG. 16 is the relative phase difference as the function of the length of coupling waveguide.

However, as mentioned earlier, the mode selectivity is also affected by the phase difference between cross-coupling and self-coupling. For partial reflector based on multimode waveguide, the phase difference is fixed once the transmissivity is determined. Thus, we introduce a short waveguide as coupling waveguide between the output ports of two partial reflectors. In this way, the cross-coupling light will propagate through the coupling waveguide and introduce extra phase difference. Then it is easy to deduce that the relative phase difference changes with the length of coupling waveguide. The simulation results are shown in FIG. 16. The width of coupling waveguide is set to 3 μm, and then the relative phase difference shows an approximately linear relation with the length of coupling waveguide $L_m$. Meanwhile, $L_m$ has nearly no effect on the intensity coupling coefficient. After the values of $W_{mmi}$, $L_{mmi}$, $W_m$ are determined, we could scan the length of coupling waveguide until the relative phase difference is near odd times of π.

One advantage of the laser in present invention is that it can be fabricated through simple etching process, which makes it more suitable to be integrated into large scale photonic integrated circuits. Among all structures shown in FIG. 1, the optical waveguides 102 and 202, the transitional waveguides 106 and 206, and the multimode waveguides 107 and 207 are shallow-etched ridge waveguides and fabricated through the process similar to that of a Fabry-Perot laser. The reflecting elements 101 and 201, TIR corner mirrors 104, 105, 204 and 205, and the coupling waveguide 3 are fabricated through an additional deep etching step.

Figure 17:
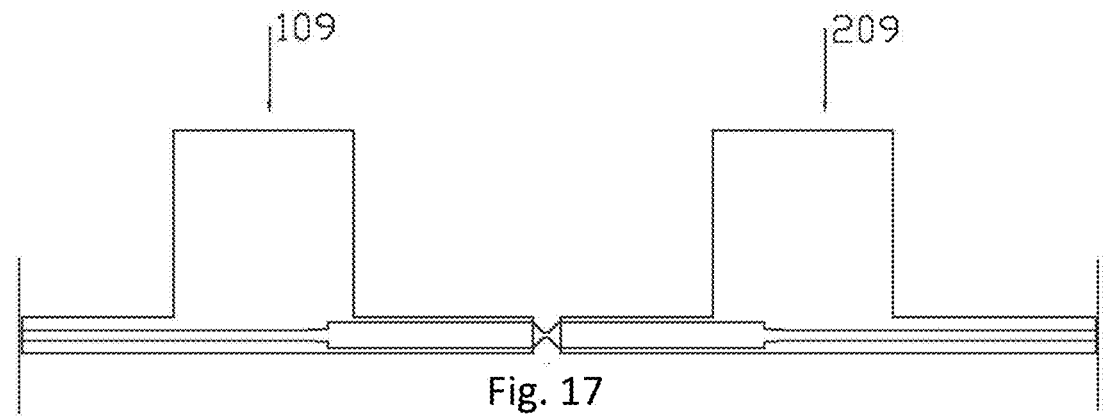
FIG. 17 is one type of electrodes arrangement of the laser.

There should be at least one waveguide structure being made of active quantum well material which could be electrically pumped to produce the optical gain of laser. At least one part of optical waveguides 102 and 202 should be made of material whose refractive index could be changed through electrical injection. FIG. 17 shows the simplest electrodes arrangement of laser, where resonant cavity one is under the electrode 109 and resonant cavity two is under the electrode 209. All structures are made of same active quantum well material. Both electrodes 109 and 209 can be pumped to provide optical gain. Changing the injecting current on any electrode can switch the output wavelength via heat-induced refractive index change. Considering that only two current sources are needed and one of them needs to be controlled in wavelength tuning, the present invention much easier to be large scale integrated.

Figure 18:
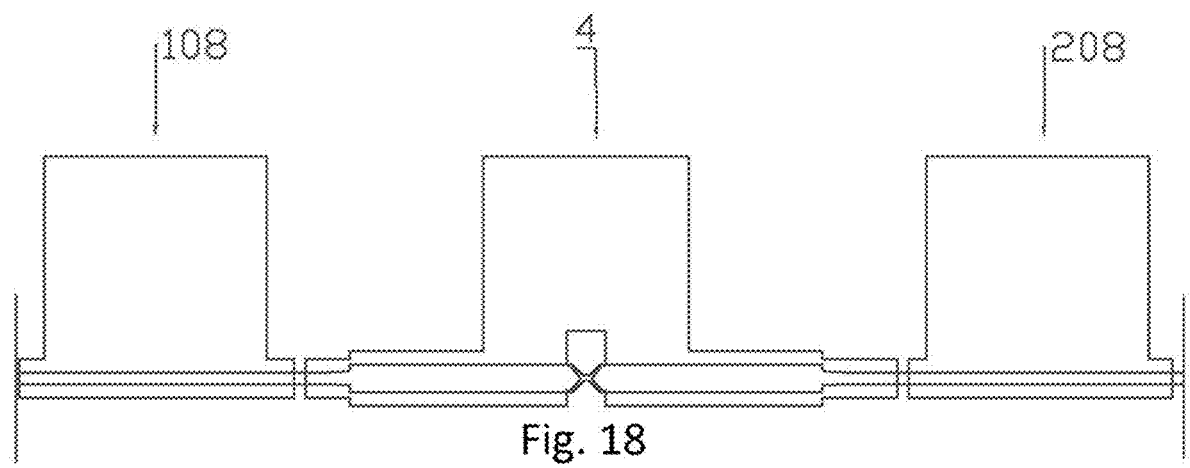
FIG. 18 is another type of electrodes arrangement of the laser.

In some applications, we need the laser to be directly modulated and working as a transmitter. FIG. 18 shows another kind of electrodes arrangement applicable to direct modulation. The coupler section and a certain fraction of waveguides 102 and 202 are under one common electrode 4, the remaining part of waveguides 102 and 202 are under two independent electrodes 108 and 208. Since electrode 4 covers the same proportion of each resonant cavity, changing the injecting current on it would not change the output wavelength so that it can be used to apply modulated signal. Meanwhile, both electrodes 108 and 208 can be used as wavelength tuning electrode.

Figure 19:
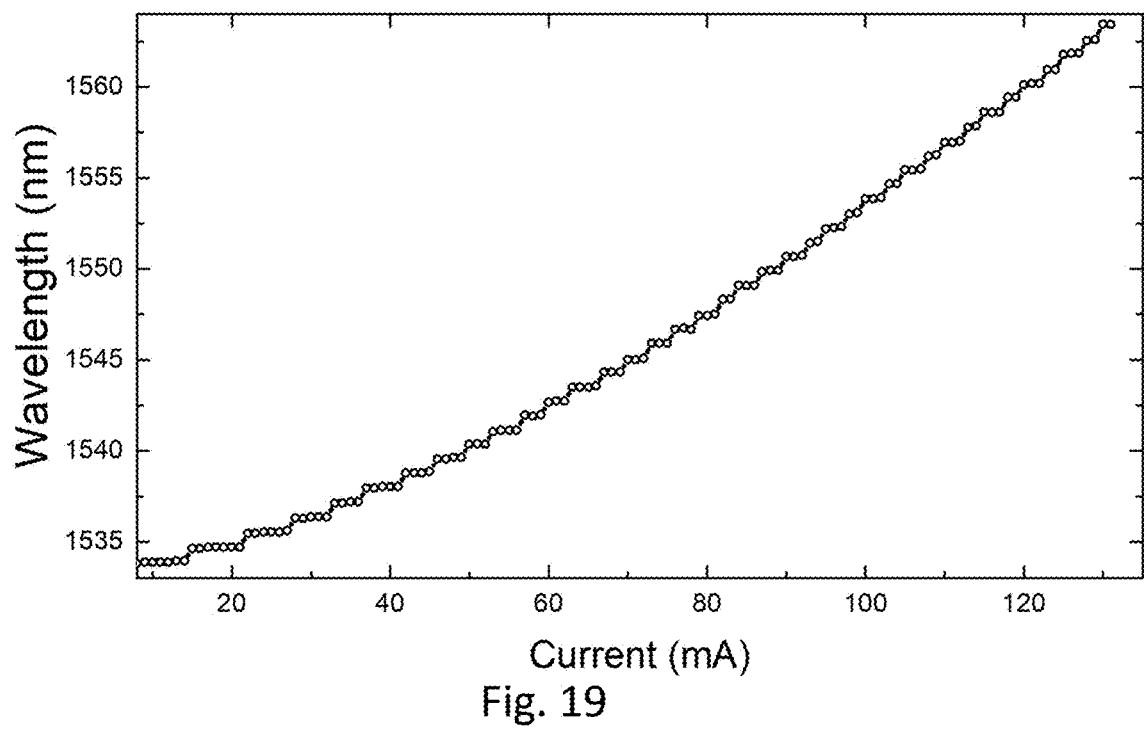
FIG. 19 is the measured single-electrode tuning curve of a fabricated laser shown in FIG. 17.
Figure 20:
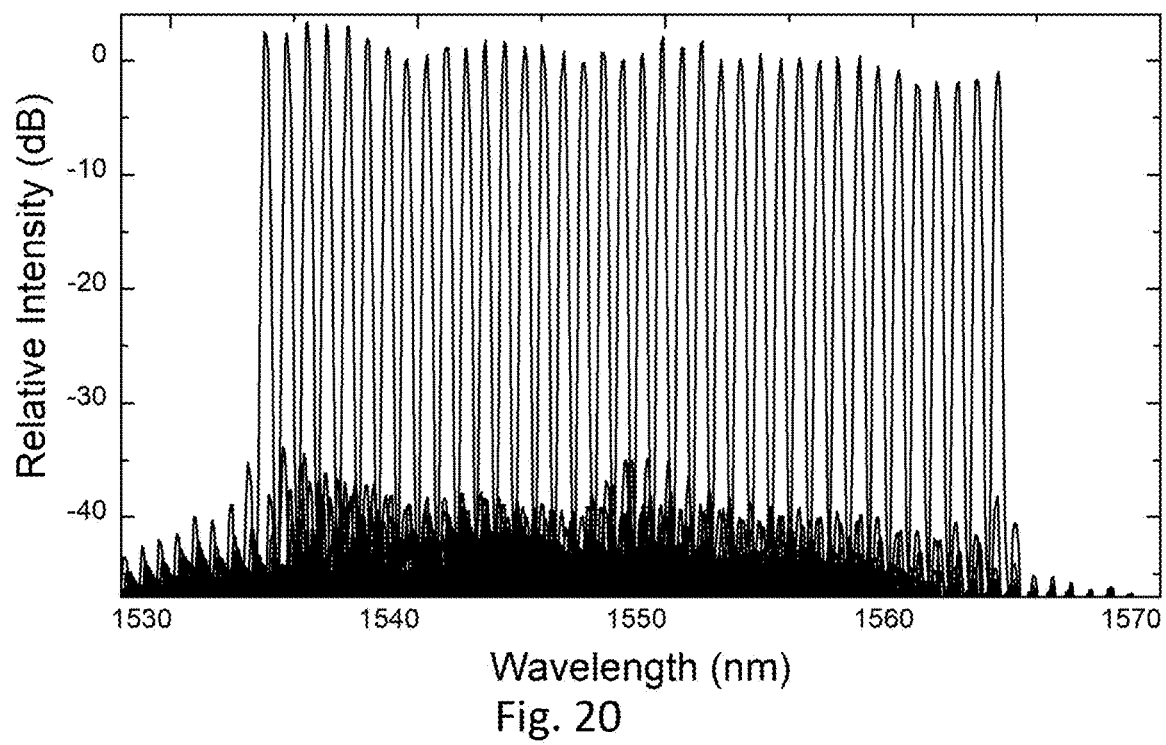
FIG. 20 is the measured superimposed spectrum of a fabricated laser shown in FIG. 17.

We tested a well-fabricated laser using electrode arrangement as shown in FIG. 18. The optical length of resonant cavity one is designed according to 100 GHz channel spacing and the length difference is 5%. The measured single electrode tuning result is shown in FIG. 19. By changing the current on electrode 108 from 10 mA to 130 mA, the output wavelength changes from 1533.9 nm to 1563.5 nm. The superimposed spectrum is shown in FIG. 20. The large tuning range of 29.6 nm, covering 38 channels with 100 Ghz frequency spacing is achieved. The side mode suppression ratios (SMSR) of all channels are larger than 35 dB, and the best SMSR is larger than 40 dB.

Figure 21:
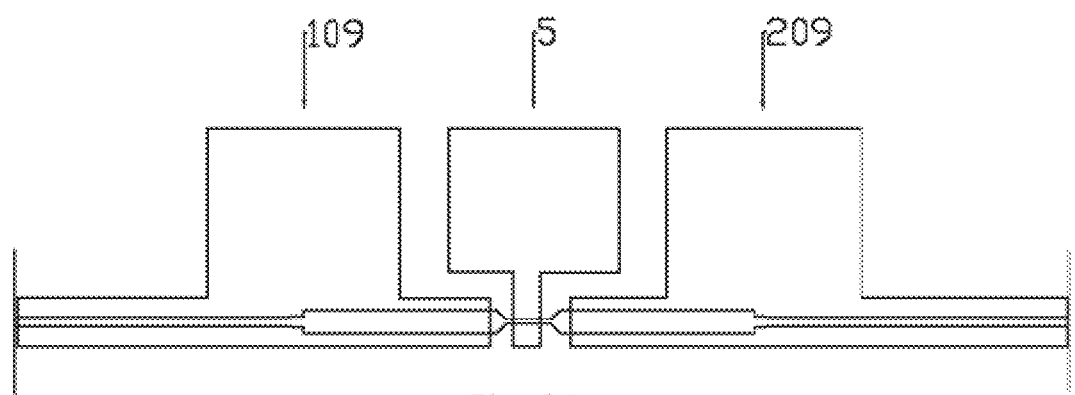
FIG. 21 is another type of electrodes arrangement of the laser.

Another type of the electrode arrangement of the resonator is shown in FIG. 21. An electrode 109 is set on the waveguide 102 and the second partial reflector 103 of one resonator, and an electrode 209 is set on the waveguide 202 and the second partial reflector 203 of the other resonator. Applying voltage or current to these two electrodes can provide gain. Changing the voltage or current can change the transmission wavelength of the semiconductor laser. In particular, the coupling waveguide 3 is provided with an independent electrode 5, which can change the coupling relationship between the two resonators by adjusting the voltage or current of this electrode, thereby adjusting the single mode selectivity of the semiconductor laser.

Figure 22:
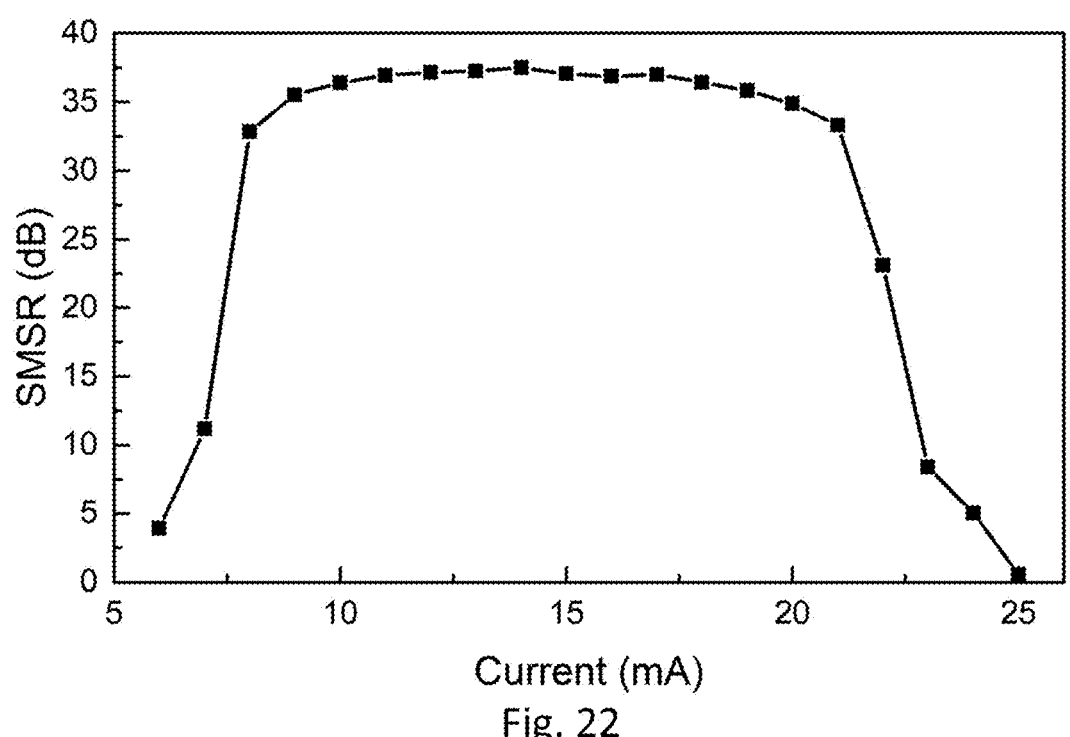
FIG. 22 is the relationship between the measured SMSR and the current of the coupling waveguide electrode based on a fabricated laser shown in FIG. 21.

The single electrode tuning result of this type of semiconductor laser is similar to FIG. 19. In particular, fixing the currents of the electrodes 109 and 209 and making the semiconductor lasers operate in one output channel, then adjusting the current of the coupling waveguide electrode 5, the variation of this channel's SMSR is shown in FIG. 22. When the current of the electrode 5 is 14 mA, this channel achieves an optimal SMSR of 37.5 dB.

What is claimed is:

1. A semiconductor laser based on half-wave coupled partial reflectors, comprising: two optical resonant cavities, wherein one resonant cavity is mainly composed of a first optical waveguide (102), a first partial reflector (101), and a second partial reflector (103); the other resonant cavity is composed of mainly composed of a second optical waveguide (202), a third partial reflector (201), and a fourth partial reflector (203); the two resonant cavities are arranged along the same straight line and are coupled to each other, and the second partial reflector (103) and the fourth partial reflector (203) in the two resonant cavities are connected by means of a coupling waveguide (3); the second partial reflector (103) and the fourth partial reflector (203) of the two resonant cavities are light splitting devices; one part of the light in one resonant cavity is reflected back to the original cavity, and the other part of the light is transmitted into the other cavity through the coupling waveguide (3); the second partial reflector (103) or the fourth partial reflector (203) of the two resonant cavities is composed of a tapered waveguide, a total internal reflection (TIR) corner mirror group and a multimode waveguide; the TIR corner mirror group comprises two 45-degree TIR corner mirrors which are connected side-by-side; one end of the tapered waveguide is connected to the first optical waveguide (102) or the second optical waveguide (202), and the other end of the tapered waveguide is connected to one end of the multimode waveguide; the other end of the multimode waveguide is connected to the TIR corner mirror group; the other end of the TIR corner mirror group is connected to the coupling waveguide (3); a light beam transmitted from the first optical waveguide (102) or the second optical waveguide (202) is expanded and divided into three parts by the tapered waveguide and the multimode waveguide; and two parts of the light on both sides are reflected back to the first optical waveguide (102) or the second optical waveguide (202) of the original resonator through the two 45-degree TIR corner mirrors, and the other part is transmitted into another resonator through the coupling waveguide (3).

2. The semiconductor laser based on half-wave coupled partial reflectors according to claim 1, wherein the second partial reflector (103) or the fourth partial reflector (203) of the two resonant cavities is composed of a tapered waveguide and the two 45-degree TIR corner mirrors; one end of the tapered waveguide is connected to the first optical waveguide (102) or the second optical waveguide (202), and the other end of the tapered waveguide is connected to the TIR corner mirror group; the other end of the TIR corner mirror group is connected to the coupling waveguide (3); the light beam transmitted from the first optical waveguide (102) or the second optical waveguide (202) is expanded and divided into three parts by the tapered waveguide; and two parts of the light on both sides are reflected back to the first optical waveguide (102) or the second optical waveguide (202) of the original resonator through the two 45-degree TIR corner mirrors, and the other part is transmitted into another resonator through the coupling waveguide (3).

3. The semiconductor laser based on half-wave coupled partial reflectors according to claim 1, wherein the two resonant cavities have different optical lengths; thus, only one resonant frequency of the two resonant cavities coincides within the gain spectrum; the effective refractive index of both resonant cavities is changed by applying current or voltage so as to realize wavelength tuning; one electrode is arranged on the first optical waveguide (102) and the second partial reflector (103) of one resonant cavity, and one electrode is arranged on the second optical waveguide (202) and the fourth partial reflector (203) of the other resonant cavity; and the voltage or current applied to both two electrodes can provide optical gain, and the output wavelength of the semiconductor laser can be changed by changing the voltage or current.

4. The semiconductor laser based on half-wave coupled partial reflectors according to claim 3, wherein one electrode is arranged on the first optical waveguide (102) and the second partial reflector (103) of one resonant cavity, and one electrode is arranged on the second optical waveguide (202) and the fourth partial reflector (203) of the other resonant cavity; the voltage or current applied to both two electrodes can provide gain, and the output wavelength of the semiconductor laser can be changed by changing the voltage or current; an electrode is disposed on the coupling waveguide (3); and changing the voltage or current of the electrode can change the coupling relationship between the two resonant cavities, thereby adjusting the mode selectivity of the semiconductor laser.

5. The semiconductor laser based on half-wave coupled partial reflectors according to claim 4, wherein the second partial reflector (103) and the fourth partial reflector (203) of two resonators are under one common electrode; applying voltage or current to the electrode can provide optical gain; the modulation signal can be applied to the voltage or current on this electrode to modulate the semiconductor laser; the optical lengths of the first optical waveguide (102) and the second optical waveguide (202) of the two resonators are different and two electrodes are set thereon respectively as the tuning electrodes, and one electrode is used as the tuning area electrode; the output wavelength of the semiconductor laser can be changed digitally in tuning range by changing the applied voltage or current on one tuning electrode, while the output wavelength of the semiconductor laser can be fine-tuned by changing the applied voltage or current on the other tuning electrode.

6. The semiconductor laser based on half-wave coupled partial reflectors according to claim 3, wherein the second partial reflector (103) and the fourth partial reflector (203) of two resonators are under one common electrode; applying voltage or current to the electrode can provide optical gain; the modulation signal can be applied to the voltage or current on this electrode to modulate the semiconductor laser; the optical lengths of the first optical waveguide (102) and the second optical waveguide (202) of the two resonators are different and two electrodes are set thereon respectively as the tuning electrodes, and one electrode is used as the tuning area electrode; the output wavelength of the semiconductor laser can be changed digitally in tuning range by changing the applied voltage or current on one tuning electrode, while the output wavelength of the semiconductor laser can be fine-tuned by changing the applied voltage or current on the other tuning electrode.

\* \* \* \* \*